(12) United States Patent
Benito Gutierrez et al.

(10) Patent No.: US 9,556,069 B2
(45) Date of Patent: Jan. 31, 2017

(54) MIRROR WITH OPTIONAL PROTECTIVE PAINT LAYER, AND/OR METHODS OF MAKING THE SAME

(71) Applicant: Centre Luxembourgeois de Recherches pour le Verre et la Ceramique S.A. (C.R.V.C.), Dudelange (LU)

(72) Inventors: Guillermo Benito Gutierrez, Pamplona (ES); Javier Unquera Algorri, Saragossa (ES); Angel Alvarez Rodriguez, Tudela (ES)

(73) Assignee: Centre Luxembourgeois de Recherches pour le Verre et la Ceramique (C.R.V.C.) SaRL, Grand Duche de Luxembourg (LU)

( * ) Notice: Subject to any disclaimer, the term of this patent is extended or adjusted under 35 U.S.C. 154(b) by 0 days.

(21) Appl. No.: 13/873,721

(22) Filed: Apr. 30, 2013

(65) Prior Publication Data

US 2013/0295391 A1    Nov. 7, 2013

Related U.S. Application Data

(60) Provisional application No. 61/642,677, filed on May 4, 2012.

(51) Int. Cl.
*C03C 17/36* (2006.01)
*C23C 14/06* (2006.01)
(Continued)

(52) U.S. Cl.
CPC ........... *C03C 17/3663* (2013.01); *C03C 17/36* (2013.01); *C03C 17/3602* (2013.01);
(Continued)

(58) Field of Classification Search
CPC .. C03C 17/36; C03C 17/3613; C03C 17/3618; C03C 17/3626; C03C 17/3639; C03C 17/3644; C03C 17/3652; C03C 17/3663; C03C 17/3689; C03C 17/3692; C03C 17/3649; C03C 17/38; C23C 14/10; C23C 14/18; C23C 14/06; C23C 14/0682; C23C 14/0652; G02B 1/105; G02B 5/0808; G02B 5/0858; G02B 5/0866; G02B 27/0006; G02B 5/085; G02B 5/0875; G02B 2006/12104
See application file for complete search history.

(56) References Cited

U.S. PATENT DOCUMENTS 3,939,126 A * 2/1976 Carder et al. .......... 528/75
4,056,313 A 11/1977 Arbogast
(Continued)

FOREIGN PATENT DOCUMENTS

DE 36 26 780 2/1988
EP 1 113 295 7/2001
(Continued)

OTHER PUBLICATIONS

ACRILAC 200 UV composition.*
(Continued)

*Primary Examiner* — Michael Band
(74) *Attorney, Agent, or Firm* — Nixon & Vanderhye P.C.

(57) ABSTRACT

Certain example embodiments of this invention relate to sputtered aluminum second surface mirrors with permanent protective coatings optionally provided thereto, and/or methods of making the same. A mirror coating supported by a substrate may include, for example, first and second silicon-inclusive layers sandwiching a metallic or substantially metallic layer including aluminum, and an optional layer including Ni and/or Cr in direct contact with the
(Continued)

metallic or substantially metallic layer comprising aluminum. A protective paint is disposed directly over and contacting an outermost layer of the mirror coating. The protective paint, once applied and cured, is adapted to survive seven day exposure to an 85 degree C. temperature at 85% relative humidity, as well as seven day exposure to a 49 degree C. temperature at 100% relative humidity.

24 Claims, 4 Drawing Sheets

(51) Int. Cl.
  *C23C 14/10* (2006.01)
  *G02B 5/08* (2006.01)
  *G02B 27/00* (2006.01)
  *C03C 17/38* (2006.01)
  *C23C 28/00* (2006.01)

(52) U.S. Cl.
  CPC ...... *C03C 17/3618* (2013.01); *C03C 17/3626* (2013.01); *C03C 17/3649* (2013.01); *C03C 17/3652* (2013.01); *C03C 17/38* (2013.01); *C23C 14/06* (2013.01); *C23C 14/0652* (2013.01); *C23C 14/0682* (2013.01); *C23C 14/10* (2013.01); *C23C 28/30* (2013.01); *G02B 5/085* (2013.01); *G02B 5/0858* (2013.01); *G02B 5/0875* (2013.01); *G02B 27/0006* (2013.01)

(56) References Cited

U.S. PATENT DOCUMENTS

| | | | |
|---|---|---|---|
| 4,059,094 A | 11/1977 | Barrio de Mendoza | |
| 4,117,682 A | 10/1978 | Smith | |
| 4,161,942 A | 7/1979 | Monk | |
| 4,237,864 A | 12/1980 | Kravitz | |
| 4,288,479 A * | 9/1981 | Brack | 428/40.5 |
| 4,572,160 A | 2/1986 | Blikken et al. | |
| 4,608,964 A | 9/1986 | Russo | |
| 4,963,012 A | 10/1990 | Tracy et al. | |
| 5,030,594 A | 7/1991 | Heithoff | |
| 5,195,503 A | 3/1993 | Ludlow | |
| 5,215,832 A * | 6/1993 | Hughes et al. | 428/623 |
| 5,275,149 A | 1/1994 | Ludlow | |
| 5,347,402 A | 9/1994 | Arbogast | |
| 6,050,526 A | 4/2000 | Stribling, Jr. | |
| 7,276,289 B2 | 10/2007 | Lu et al. | |
| 7,452,604 B2 * | 11/2008 | Takagi et al. | 428/426 |
| 7,557,053 B2 | 7/2009 | Thomsen et al. | |
| 7,678,459 B2 | 3/2010 | Scott et al. | |
| 7,700,869 B2 | 4/2010 | Thomsen et al. | |
| 7,700,870 B2 | 4/2010 | Thomsen et al. | |
| 7,871,664 B2 | 1/2011 | O'Connor et al. | |
| 8,702,253 B2 * | 4/2014 | Lu et al. | 359/871 |
| 2005/0018330 A1 | 1/2005 | Saloo et al. | |
| 2006/0077580 A1 | 4/2006 | Wuillaume et al. | |
| 2007/0178316 A1 | 8/2007 | Mellott | |
| 2007/0215205 A1 | 9/2007 | Thomsen et al. | |
| 2007/0221313 A1 | 9/2007 | Franck et al. | |
| 2007/0223096 A1 | 9/2007 | O'Connor et al. | |
| 2007/0223121 A1 | 9/2007 | Franck et al. | |
| 2007/0291384 A1 | 12/2007 | Wang | |
| 2008/0073203 A1 | 3/2008 | Wang et al. | |
| 2008/0164173 A1 | 7/2008 | Savakus | |
| 2009/0101208 A1 | 4/2009 | Vandal et al. | |
| 2009/0217978 A1 | 9/2009 | Thomsen et al. | |
| 2009/0223252 A1 | 9/2009 | Fulton et al. | |
| 2010/0122728 A1 | 5/2010 | Fulton et al. | |
| 2010/0229853 A1 | 9/2010 | Vandal et al. | |
| 2010/0255980 A1 | 10/2010 | Fulton et al. | |
| 2011/0176212 A1 | 7/2011 | Lu et al. | |
| 2011/0176236 A1 | 7/2011 | Lu et al. | |
| 2012/0087029 A1 | 4/2012 | Vandal et al. | |
| 2013/0170059 A1 * | 7/2013 | Lingle et al. | 359/884 |

FOREIGN PATENT DOCUMENTS

| | | |
|---|---|---|
| EP | 1 918 740 | 5/2008 |
| GB | 2 363 130 | 12/2001 |
| KR | 10-2009-0132794 | 12/2009 |
| WO | WO 2011/090784 | 7/2011 |

OTHER PUBLICATIONS

ACRILAC 400 UV composition.*
U.S. Appl. No. 61/282,307, filed Jan. 19, 2010; Lu et al.
U.S. Appl. No. 61/642,677, filed May 4, 2012; Benito Gutierrez et al.
International Search Report issued in PCT/US2011/000099 on Apr. 1, 2011.
Nitto Denko Product SPV 9310-SPV 9320; Surface Protection Tapes, Dec. 2007 (2pgs).
Nitto Denko, SPV 30800 Series, Surface Protection Tapes, Dec. 2007 (2pgs).
Nitto Denko, SPV A-Series, Surface Protection Tapes, Dec. 2007 (2pgs).

* cited by examiner

| PPF Material | Product Durability ||||||||||
| | Environmental Performance |||| Chemical Performance || Mechanical Performance ||||
| | HTHH | Salt Fog | 85/85 | Thermal Cycling | Thermal Dwell | Cutting Oil | Windex | Adh. Rank | Adh. Meas. | Brush | Scratch |
|---|---|---|---|---|---|---|---|---|---|---|---|
| Novacel 9084 | 1 | 1 | 1 | 1 | 1 | 1 | 1 | 8 | 10.8 | 1 | 1 |
| Novacel 4160 | 2 | 3 | 1 | 1 | 4 | 1 | 1 | 6 | 15.3 | 1 | 1 |
| Novacel 9840 | 3 | 2 | 4 | 8 | 5 | 1 | 1 | 1 | 53.4 | 1 | 1 |
| B+K 90K | 4 | 5 | 1 | 5 | 1 | 1 | 7 | 2 | 33.3 | 1 | 1 |
| B+K 50110 | 8 | 8 | 5 | 6 | 1 | 1 | 1 | 4 | 26.0 | 1 | 1 |
| Nitto 4058-HF | 6 | 6 | 6 | 7 | 7 | 1 | 1 | 5 | 22.2 | 1 | 1 |
| Novacel 4333 | 5 | 7 | 7 | 4 | 8 | 8 | 8 | 7 | 11.7 | 1 | 1 |
| Nitto 4068-H | 7 | 4 | 8 | 1 | 6 | 1 | 1 | 3 | 27.5 | 1 | 1 |
| Novacel 4483 | | | | | | | | | | | |

MIRROR WITH OPTIONAL PROTECTIVE PAINT LAYER, AND/OR METHODS OF MAKING THE SAME

CROSS-REFERENCE TO RELATED APPLICATIONS

This application claims the benefit of U.S. Application Ser. No. 61/642,677, filed on May 4, 2012, the entire contents of which is hereby incorporated by reference. This application also incorporates by reference the entire contents of Ser. No. 13/338,644, filed on Dec. 28, 2011.

FIELD OF THE INVENTION

Certain example embodiments of this invention relate to second surface mirrors, and/or methods of making the same. More particularly, certain example embodiments relate to sputtered aluminum second surface mirrors with protective paint coatings optionally provided thereto, and/or methods of making the same. In certain example instances, such mirrors may be used in interior residential, commercial, appliance, and/or other applications, e.g., with very high visible glass side reflectance and very low production-related costs.

BACKGROUND AND SUMMARY OF EXAMPLE EMBODIMENTS OF THE INVENTION

Mirrors have been in existence for years and have been used in interior building applications such as, for example, in bathrooms, as decorations, etc.; for exterior applications such as, for example, in concentrating solar power (CSP) and concentrating photovoltaic (CPV) applications, as well as in secondary reflector panels (SRPs); as well as handheld vanity and a host of other products. Mirrors generally are either (a) first surface mirrors, where the mirror coating is provided between the viewer and the supporting glass substrate, or (b) second surface mirrors, where the supporting glass substrate is interposed between the viewer and the mirror coating. See, for example, U.S. Pat. Nos. 7,276,289 and 7,678,459; U.S. Publication Nos. 2006/0077580; 2007/0178316; 2008/0073203; 2008/0164173; 2010/0229853; 2011/0176212; 2011/0176236; and 2012/0087029. The entire content of each of these patent documents is hereby incorporated herein by reference.

Many second surface mirrors include silver-based reflecting layers. Silver is highly reflective in the visible and infrared ranges, therefore making it a good choice from a total reflectance perspective.

Unfortunately, however, silver is quite expensive. It also is not particularly durable and, for example, is subject to corrosion when exposed to even building interior environments. Durability problems can be overcome with silver-inclusive mirrors, however, by applying one or more layers of protective paint. Yet these paints are sometimes expensive and, at a minimum, inject time delays in the process because they need to be coated and dried and sometimes re-coated and re-dried. Wet coating techniques also are "messy" and potentially hazardous to humans, especially where "heavy metals" are used.

Thus, it will be appreciated that there is a need in the art for improved mirrors and/or methods of making the same.

In certain example embodiments of this invention, a mirror is provided. A multilayer thin film coating is supported by a substrate. The multilayer thin film coating comprises, in order moving away from the substrate: a first silicon-inclusive layer, a metallic or substantially metallic layer comprising aluminum, an optional layer comprising Ni and/or Cr in direct contact with the metallic or substantially metallic layer (e.g., comprising aluminum), and a second silicon-inclusive layer in direct contact with the layer comprising Ni and/or Cr. A protective paint is wet-applied directly over and contacting an outermost layer of the multilayer thin film coating, with the protective paint being applied to ensure a post-cure density of at least 5 (and more preferably at least 10, with an example of 35) grams per square meter. The protective paint is cured (e.g., using at least one UV radiation source). The protective paint, following the curing, is adapted to survive seven day exposure to an 85 degree C. temperature at 85% relative humidity, as well as seven day exposure to a 49 degree C. temperature at 100% relative humidity.

In certain example embodiments of this invention, a method of making a coated article is provided. A coating comprising at least the following layers are sputter-deposited on a glass substrate in the following order: a first silicon-inclusive layer, a metallic or substantially metallic layer (e.g., comprising aluminum), and a second silicon-inclusive layer. A protective paint is wet-applied directly over and contacting an outermost layer of the coating, with the protective paint being curable in less than 2 seconds of exposure to a UV radiation source. The protective paint is cured using at least one UV radiation source. The protective paint is wet-applied and cured at a line speed of greater than 7 meters per minute.

In certain example embodiments of this invention, a method of making mirrors is provided. The method includes, for example, receiving, at a fabricator location, a coated article made in accordance with one of the methods described herein; and cutting the coated article into pieces of one or more respective desired sizes in making the mirrors.

In certain example embodiments of this invention, a coated article is provided. A glass substrate supports a sputter-deposited coating. The coating comprises at least the following layers in the following order: a first silicon-inclusive layer, a metallic or substantially metallic layer (e.g., comprising aluminum), and a second silicon-inclusive layer. A protective paint is provided directly over and contacting an outermost layer of the coating, with the protective paint being curable in less than 2 seconds of exposure to a UV radiation source and at a line speed of greater than 7 meters per minute. The protective paint, after curing, is adapted to survive seven day exposure to an 85 degree C. temperature at 85% relative humidity, as well as seven day exposure to a 49 degree C. temperature at 100% relative humidity, with no evidence of delamination of the protective paint and no evidence of deterioration of the coating.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments of this invention relate to high performance sputtered aluminum second surface mirrors with permanent protective adhesive films and/or protective paints optionally provided thereto, and/or methods of making the same. In certain example instances, such mirrors may be used in interior residential, commercial, appliance, and/or other applications, e.g., where it is desirable to provide very high visible glass side reflectance while keeping associated production costs low.

In certain example embodiments, a coated article is provided. The coated article may comprise a substrate supporting a multi-layer, thin film coating including at least the following layers, in order, moving away from a second surface of the substrate: a first silicon-based layer (e.g., an oxide and/or nitride of silicon), a metallic or substantially metallic reflective layer comprising aluminum, optionally in direct contact with the first silicon-based layer; and a second silicon-based layer (e.g., an oxide and/or nitride of silicon) that serves as a protective layer. The first and second silicon-based layers may consist essentially of the same composition and/or may have substantially the same stoichiometries in certain example embodiments. Optionally, a protective barrier layer of or including Ni and/or Cr may be interposed between the reflective layer and the second silicon-based layer. A permanent protective film (PPF) may be applied to the film side of this layer stack for added overall durability. The PPF may be applied in solid form in certain example embodiments. In addition or as an alternative to the PPF, a protective paint may be applied to the film side of this layer stack for added overall durability. The protective paint may be applied in liquid form and rapidly cured, e.g., via exposure to UV radiation in certain example instances. When an optional PPF is used in connection with the paint, the PPF may be applied over the paint in some instances.

The aluminum-inclusive second surface mirrors of certain example embodiments may be advantageous over conventional silver-based second surface mirrors. For example, the lower material cost for aluminum may result in a reduced cost to coat as compared to a silver-based mirror. Aluminum also is known to have superior chemical, mechanical, and environmental durability as compared to silver. Certain example embodiments also may offer superior adhesion of the reflective metal to a broader range of underlying layers and/or substrates as compared to conventional mirrors. For instance, aluminum adheres well to silicon-based thin film layers, whereas silver growth is known to benefit from the presence of seed layers (e.g., of or including zinc oxide and/or an optionally oxidized Ni and/or Cr inclusive layer) in terms of both adhesion and uniformity. Aluminum also better adheres to bare glass than silver. The reflective optical properties for aluminum are also very similar to silver, even though aluminum is advantageous in the above-described and/or other ways.

Some current second surface mirrors incorporate a protective paint on the film side of the coated article. The protective paint is intended to increase chemical, mechanical, and environmental durability. This protective paint can be particularly important where silver-based sputter deposited second surface mirrors are concerned, as the silver can be damaged very easily, e.g., via scratching or marring, via oxidation through normal environmental exposure or inadvertent chemical attack, etc. However, the protective paint also may serve to protect aluminum-based potentially sputtered layers, as well. If the paint is carefully selected, it is possible to reduce the reliance on potentially costly paint application hardware and drying systems. This, in turn, may impart a substantial increase in throughput speed as compared to conventional protective paints, e.g., because application may be simplified and drying/curing steps may be made to occur much more quickly.

The protective film may help enhance the safety of the final product as compared to existing mirrors with standard protective paints. For instance, plastic protective films tend to better trap and/or contain material that may flake or otherwise come off. This also applies to glass shards that may result if the mirror is broken. Conventional paints, especially those that include heavy metals, also may be hazardous when ingested or exposed to the skin, whereas plastic protective films may be harmful only in much larger doses.

Figure 1A:
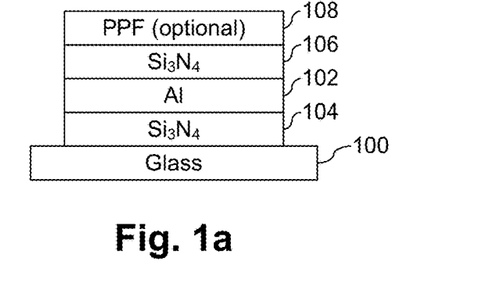
FIGS. 1a and 1b show schematic cross-sectional views of second surface mirror coatings including optional permanent protective films (PPFs) in accordance with certain example embodiments of this invention.
Figure 1B:
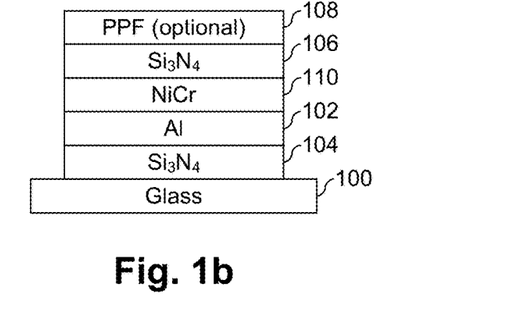

FIGS. 1a and 1b show schematic cross-sectional views of second surface mirror coatings in accordance with certain example embodiments of this invention. As shown in FIG. 1a, a glass substrate 100 supports a mirror coating including plural sputter-deposited thin film coatings and an optional PPF. More particularly, as shown in FIG. 1a, an Al-based metallic layer 102 is sandwiched between first and second layers including silicon nitride (e.g., $Si_3N_4$ or other suitable stoichiometry) 104 and 106. A PPF film 108 is optionally provided as an outermost protective coating. The Al-based metallic layer may be a "3-9s purity" or commercial grade T6061 aluminum alloy in certain example instances. In the FIG. 1a example, the Al-based metallic layer 102 is in direct contact with the first and second layers including silicon nitride 104 and 106.

The layer stack design shown in FIG. 1b is identical to the FIG. 1a design, except that a layer including Ni and/or Cr 110 (NiCr in the FIG. 1b example) has been added. This layer including Ni and/or Cr 110 may be used to increase chemical, mechanical, and environmental durability, as may be the case when the aluminum mirror stack is provided without the optional permanent protective plastic film 108.

Figure 2:
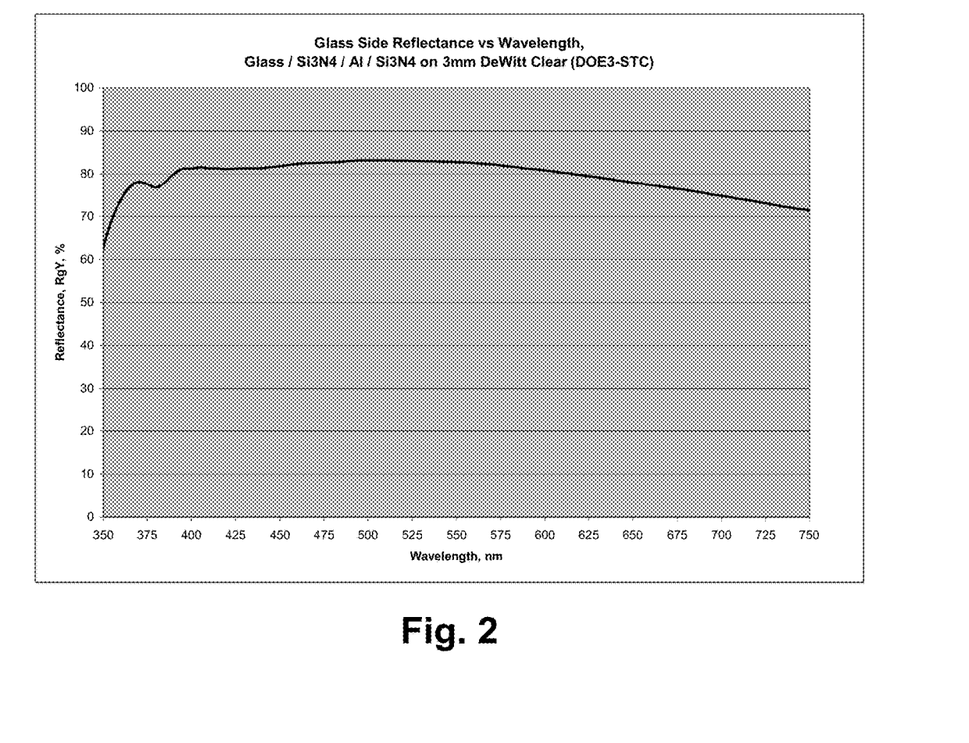
FIG. 2 is a graph that plots glass side reflectance versus wavelength for the FIG. 1a example embodiment over the 350-750 nm wavelength range.

The FIG. 1a layer stack was coated on a 3.0 mm thick clear float glass substrate. The Al-based metallic layer 102 was 450 angstroms thick, and the first and second layers including silicon nitride 104 and 106 were 40 angstroms thick and 80 angstroms thick, respectively. No PPF was provided in this sample. The glass side reflectance was measured with a Perkin-Elmer double beam spectrophotometer. The data was corrected to an NIST traceable standard over the visible wavelength range. Visible glass side reflectance was calculated using an Ill. 'C', 2 degree observer. With these parameters, glass side visible reflectance, RgY, was measured at 82.03%. FIG. 2 is a graph that plots glass side reflectance versus wavelength for the FIG. 1a example embodiment over the 350-750 nm wavelength range. It is noted that a thinner (e.g., 2.3 mm clear float) glass substrate would have result in slightly higher glass side reflectivity.

In FIGS. 1a and 1b, the Al-based metallic layer 102 preferably is 200-800 angstroms thick, more preferably 300-700 angstroms thick, and still more preferably 400-600 angstroms thick. Thickness ranges from 250-650 angstroms also are effective in certain example instances. The Al-based metallic layer 102 layer is primarily responsible for the very high reflectance in the visible (and near infrared) portion of the spectrum. At this thickness level, light transmission is reduced to about 1% over the visible and near infrared portion of the solar spectrum. The thickness of the Al-based metallic layer 102 may be increased or decreased to raise or lower reflectance, keeping all else equal. Certain example embodiments preferably provide a glass side reflectance (Ill. C/2 degrees) of >70%, more preferably >75%, with example reflectances of 77% and 82% being possible for different desired applications. Such reflectances may be measured on ~2.3 mm (e.g., 2-3 mm) thick clear float glass substrates. It is noted that the provision of an Al-based layer between 250-360 angstroms, when applied to 3.0 mm clear float glass, can be used in connection with the techniques described herein to produce a glass side reflectance of about 78% with a light transmission of about 1.5%.

Although the coatings described above in connection with FIGS. 1a and 1b are arguably somewhat similar to the SunGuard products provided by the assignee of the instant invention, there nonetheless are several differences. For example, the SunGuard Low-E and Non Low-E products provided by the assignee of the instant invention have a much lower visible reflectance than what is would be acceptable for many mirror applications. Thus, while the layers and layer orders used in the example aluminum mirrors shown and described herein arguably are somewhat similar to those used in SunGuard Low-E and Non Low-E products, there are major differences between both products.

For example, where the SunGuard Low-E layer stack has a first silicon nitride inclusive undercoat layer in contact with the glass that has a thickness greater than about 100 angstroms, the aluminum mirror layer stack of certain example embodiments includes a first silicon nitride inclusive undercoat layer in contact with the glass of less than 100, with an example thickness of 40 angstroms. It has been determined that a thickness of 40 angstroms also would be sufficient for certain example embodiments. The use of the silicon nitride inclusive undercoat in SunGuard layer stacks has been shown to improve the chemical, environmental, and mechanical durability of the full stack compared to an otherwise identical layer stack that does not employ such an undercoat layer. The same has been shown in experiments for the aluminum mirror layer stack of certain example embodiments. That is, while aluminum generally adheres poorly to float glass, the addition of a very thin layer including silicon nitride between the aluminum layer and the float glass improves adhesion dramatically. However, maintaining the silicon nitride inclusive undercoat thickness at less than 40 angstrom reduces the loss of visible reflectance of the overall layer stack while also maintaining the improvements in durability mentioned above. Thus, the inventors have determined that a thickness of less than 100 angstroms, and sometimes even less than 40 angstroms, is desirable both for good adhesion and high reflectivity. In certain example embodiments, the first layer including silicon nitride 104 is preferably less than 100 angstroms thick, more preferably less than 75 angstroms thick, and still more preferably less than 50 angstroms thick.

A very thin Ni and/or Cr inclusive layer optionally may be deposited after the Al-inclusive metal layer to further improve overall durability. The thickness of this optional layer, when provided, preferably is between 1-150 angstroms, more preferably 1-50 angstroms, and still more preferably 5-20 angstroms. In general, a thickness of even 5-10 angstroms has been found to increase overall durability. The layer comprising Ni and/or Cr also may help reduce the visible transmission to nearly 0%, possibly also improving visible reflectivity and also helping to adhere the Al-based layer to the protective overcoat layer comprising silicon nitride. The ratio of Ni-to-Cr may be 80/20, or any other suitable ratio. It is noted that a layer comprising NiCr layer may add complexity and expense, and may not always be necessary as the aluminum-based mirror layer stack can in some implementations be adequately protected by a permanent protective plastic film. Thus, certain example embodiments may omit a layer comprising Ni and/or Cr, e.g., when a PPF is provided, although these material are not necessarily mutually exclusive alternatives in all embodiments. It is noted that the layer comprising Ni and/or Cr may serve as an "environmentally protective layer" but also may help increase overall coating thickness in a manner that helps reduce light transmission (e.g., preferably below 3%, more preferably below 2%, and still more preferably below 1-1.5%, and possibly all the way to 0%). This may be advantageous because it may reduce the need to increase the thickness of the layer comprising aluminum and/or to provide an opaque PPF, e.g., in order to accomplish suitable visible light transmission reductions.

The second layer including silicon nitride 106 is preferably 10-1000 angstroms thick, more preferably 50-500 angstroms thick, and still more preferably 70-200 angstroms thick. This layer may help provide mechanical, chemical, and environmental durability. It also may be much thicker than the silicon nitride inclusive undercoat layer, as its thickness will have little to no practical impact on glass side reflectivity. In practice, a thickness of about 80 angstroms has been found to be sufficient to provide adequate overall durability at reasonable cost. It is noted that the thickness may be increased in the absence of PPF or decreased when PPF is present, although this need not always be the case, e.g., where further durability is desirable.

Certain example embodiments may incorporate a permanent protective film (PPF) with very high adhesion levels, very good chemical resistance, and/or excellent environmental durability. The protective film may be resistant to delamination from moisture penetration and/or the use of asphalitic based adhesives applied to the exterior surface of the protective film. Adhesive strengths of the protective films are greater than or equal to 150 cN/20 mm wide strip, more preferably 275 cN/20 mm wide strip, as measured in the tape removal test. For instance, certain example embodiments may have an adhesive strength of 200-500 cN/20 mm wide strip, more preferably 200-300 cN/20 mm wide strip. Certain example embodiments may even have an adhesive peel strength of greater than or equal to about 320-430 cN/20 mm wide strip. The peel strength test used may be the peel strength test defined in EN 1939. Good abrasion resistance also is desirable, e.g., such that the there is no change in visible appearance when viewed from the glass side after the post-PPF coated article is wiped with a rubber material at a force of 250-250 g, back and forth 20 times. In certain example embodiments, the PPF may be thin, e.g., having a thickness of <200 microns, and sometimes about 40-100 microns in thickness. Peel strength may be increased through the incorporation of additional cross-linking polymers in certain example embodiments.

The protective film may also be relatively low in cost. To aid in manufacturing ease of setup, it would be desirable to use a permanent protective film that may be applied using the same equipment that is used to apply standard temporary protective films. Typical protective films from Nitto-Denko include: SPV-9310, SPV-9320, SPV-30800, SPV 5057 A5, and SPV 5057 A7. Other manufacturers of similar preferred protective films include Permacel, Tessa Tapes, B&K Films, and Novacell. These plastic films come in a wide variety of opacities and colors.

The PPFs of certain example embodiments preferably will pass environmental tests including, for example, high temperature-high humidity testing (e.g., at 49 degrees C. with 100% relative humidity), thermal cycling testing, and 85/85 testing (e.g., 85 degrees C. with 85% relative humidity). Standard ASTM tests may be performed to test for compliance, e.g., using 7 days exposure cycles. Salt fog exposure (e.g., to simulate oversees shipment) also may be tested for a 24-hour period. Permanent plastic films that do not blister or lose adhesion to the coated surface are preferred. Resistance to cutting oils and Windex also may be tested by soaking in such materials over 24 hour periods. These tests may be performed after the PPF is applied. PPFs that survive these tests are preferred because of their apparent durability and ability to withstand environmental conditions. In a similar vein, the thin film coating preferably does not delaminate after 3M 610 Scotch tape is applied thereto and removed therefrom.

Figure 7:
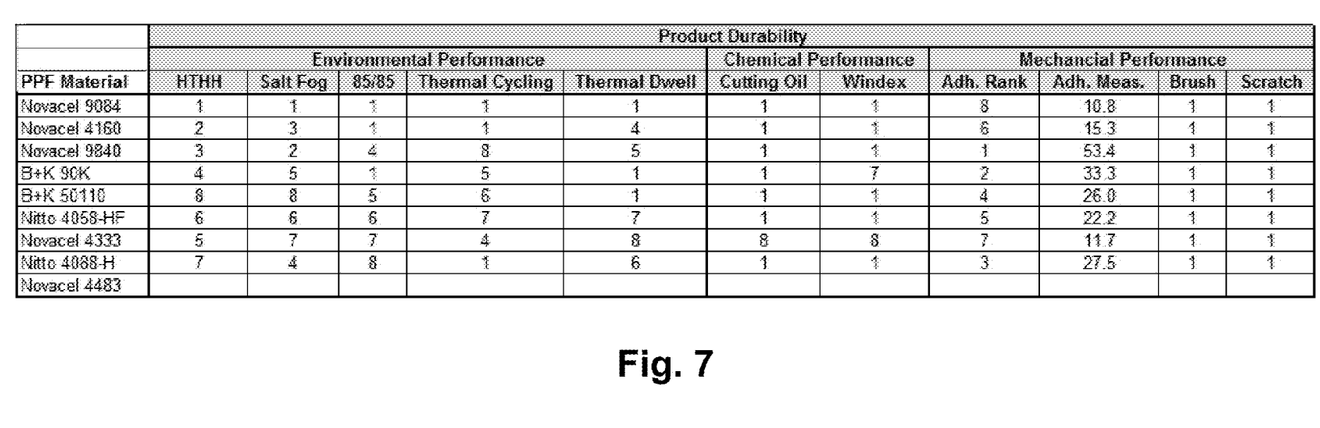
FIG. 7 is a table showing the results of various product durability tests for certain example PPF materials.

FIG. 7 is a table showing the results of various product durability tests for certain example PPF materials. The example materials in FIG. 7 are arranged in descending order of overall performance. It will be appreciated that these materials, as well as the associated tests and ranking methodology, are provided by way of example.

It has been found that the addition of the permanent plastic protective films significantly enhances the safety of the final product. For example, as alluded to above, when a mirror is broken, pieces and shards of glass sometimes adhere very strongly to the protective film. The few remaining smaller pieces of the broken mirror that do not adhere to the protective film are far less likely to cause injury to anyone in the vicinity of the mirror when the mirror is broken.

Another advantage of plastic protective films compared to current commercially available protective paints is the speed of application. In many current sputter coating facilities, for example, the typical roll applicator is able to apply the protective films at line speeds of 8.0 m/min. or greater. This is much faster than the typical process speed of 5.5 m/min. used to dry conventional paints in current painted mirror products. As was also previously mentioned, there is a reduced set of chemical safety issues related to the application of the protective film as compared to chemical paints that include heavy metals.

A number of layer stacks in addition or as alternatives to the examples shown in FIGS. 1a and 1b are envisioned and can be produced on production sputtering machines at suitable line speeds. Certain of these example stacks are described in the following examples:

Example 1: glass/$Si_3N_4$ (40 angstroms)/Al (400 angstroms)/NiCr (50 angstroms)/$Si_3N_4$ (80 angstroms). RgY (C/2): 82.32%.

Example 2: glass/$Si_3N_4$ (40 angstroms)/Al (400 angstroms)/Cr (50 angstroms)/$Si_3N_4$ (80 angstroms). RgY (C/2): 81.83%. It will be appreciated that the presence of Ni together with Cr in the layer "behind" the Al improves reflectivity.

Example 3: glass/$Si_3N_4$ (40 angstroms)/NiCr (5 angstroms)/Al (400 angstroms)/NiCr (50 angstroms)/$Si_3N_4$ (80 angstroms). RgY (C/2): 78.87%. While the presence of a layer comprising Ni and/or Cr interposed between the Al and the glass substrate may help with adhesion, it nonetheless may reduce reflectance, possibly because of increased absorption on the part of the front layer comprising Ni and/or Cr.

Example 4: glass/$Si_3N_4$ (40 angstroms)/NiCr (5 angstroms)/Al (400 angstroms)/Cr (50 angstroms)/$Si_3N_4$ (80 angstroms). RgY (C/2): 78.83%.

Example 5: glass/$Si_3N_4$ (40 angstroms)/Al (400 angstroms)/NiCr (50 angstroms)/$Si_3N_4$ (80 angstroms)/PPF (Nitto-Denko SPV-9310). RgY (C/2): 82.32%.

Example 6: glass/$Si_3N_4$ (40 angstroms)/Al (400 angstroms)/Cr (50 angstroms)/$Si_3N_4$ (80 angstroms)/PPF (Nitto-Denko SPV-9310). RgY (C/2): 81.83%.

Example 7: glass/$Si_3N_4$ (40 angstroms)/NiCr (5 angstroms)/Al (400 angstroms)/NiCr (50 angstroms)/$Si_3N_4$ (80 angstroms)/PPF (Nitto-Denko SPV-9310). RgY (C/2): 78.87%.

Example 8: glass/$Si_3N_4$ (40 angstroms)/NiCr (5 angstroms)/Al (400 angstroms)/Cr (50 angstroms)/$Si_3N_4$ (80 angstroms)/PPF (Nitto-Denko SPV-9310). RgY (C/2): 78.83%.

Example 9: glass/Al (450 angstroms)/$Si_3N_4$ (80 angstroms). RgY (C/2): 84.06%. Although reflectivity was very high, adherence to the substrate is potentially compromised because the Al is in direct contact with the glass. Sodium migration from the underlying substrate may also negatively impact the quality of the Al over time.

Example 10: glass/$Si_3N_4$ (40 angstroms)/Al (450 angstroms)/$Si_3N_4$ (80 angstroms). RgY (C/2): 82.03%.

Example 11: glass/$Si_3N_4$ (40 angstroms)/Al (450 angstroms)/NiCr (5-10 angstroms)/$Si_3N_4$ (80 angstroms). RgY (C/2): 82.04%.

Example 12: glass/Al (450 angstroms)/$Si_3N_4$ (80 angstroms)/PPF (Nitto-Denko SPV-9310). RgY (C/2): 84.06%.

Example 13: glass/$Si_3N_4$ (40 angstroms)/Al (450 angstroms)/$Si_3N_4$ (80 angstroms)/PPF (Nitto-Denko SPV-9310). RgY (C/2): 82.03%.

Example 14: glass/$Si_3N_4$ (40 angstroms)/Al (450 angstroms)/NiCr (5-10 angstroms)/$Si_3N_4$ (80 angstroms)/PPF (Nitto-Denko SPV-9310). RgY (C/2): 82.04%.

It is noted that aluminum may be added to the silicon inclusive layers and/or the layers comprising Ni and/or Cr to help improve sputtering performance. Also, although certain example embodiments have been described as including sputter-deposited layers, it will be appreciated that some or all layers may be deposited by an alternate thin film deposition technique in different embodiments of this invention.

Figure 3:
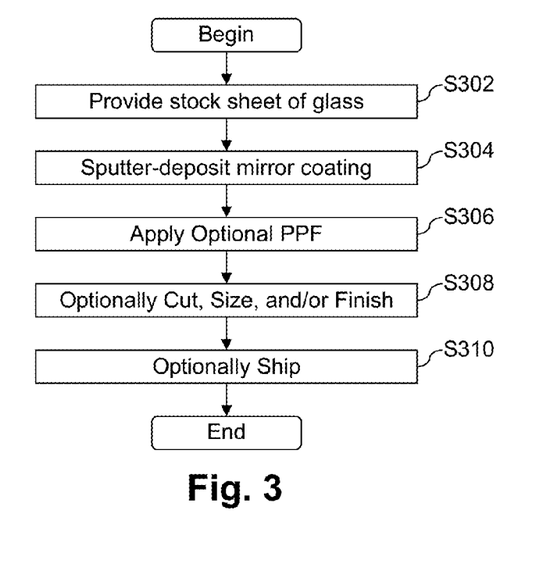
FIG. 3 is a flowchart illustrating an example process for making a mirror in accordance with certain example embodiments.

FIG. 3 is a flowchart illustrating an example process for making a mirror in accordance with certain example embodiments. A stock sheet of glass or glass substrate is provided in step S302. The glass substrate may be any suitable type of glass substrate, e.g., 1.0-10.0 mm thick, more preferably 1-5 mm thick, with example thicknesses of 2.0, 2.3, and 3.0 mm. The mirror coating is sputter deposited on a major surface (e.g., the surface designed to be the second major surface) of the substrate in step S304. Any of the above-described and/or other suitable layer stacks may be used in different embodiments of this invention. In step S306, a PPF is optionally applied, e.g., via a roll coater. The substrate may be cut, sized, and/or finished in step S308, and optionally shipped in step S310. In some cases, the finishing may include beveling, rounding, or chamfering edges, etc. Various washing and/or cleaning steps also may be performed. For instance, clear float glass may be washed prior to coating.

It will be appreciated that the steps need not be performed in the order shown in FIG. 3. For instance, a stock glass substrate may be coated and protected with PPF, shipped to a fabricator, and then optionally cut, sized, and/or finished by the fabricator, where it may then be built into a suitable protect (e.g., a bathroom mirror, decorative home or office mirror, etc.). In one or more steps not shown, the coating may be edge deleted, e.g., such that the PPF is applied directly onto the glass at edge portions. The edge deleted portions in such cases may be built into finished products such that the non-reflective areas are not visible. The PPF nonetheless may protect the entire back surface, although the mirror coating may be better protected because it does not all the way to the outer edge of the substrate where it may be exposed inadvertently through manufacturing or installation processes that move the PPF, through normal side exposure of a few angstroms or nanometers, etc.

Figure 4A:
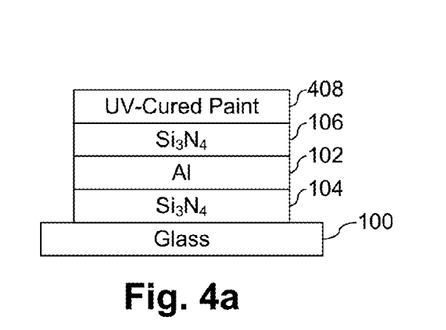
FIGS. 4a and 4b show schematic cross-sectional views of second surface mirror coatings including protective paints in accordance with certain example embodiments of this invention.
Figure 4B:
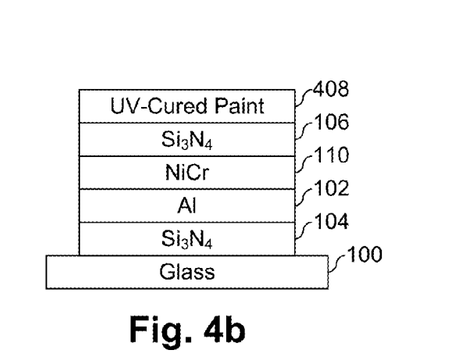
Figure 5A:
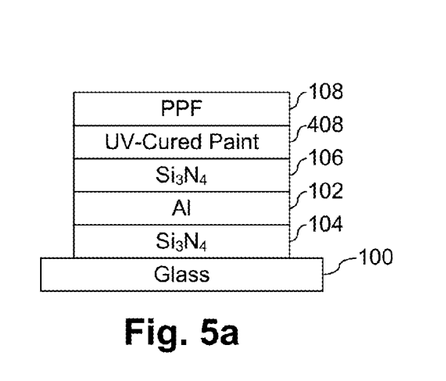
FIGS. 5a and 5b show schematic cross-sectional views of second surface mirror coatings including both protective paints and PPFs in accordance with certain example embodiments of this invention.
Figure 5B:
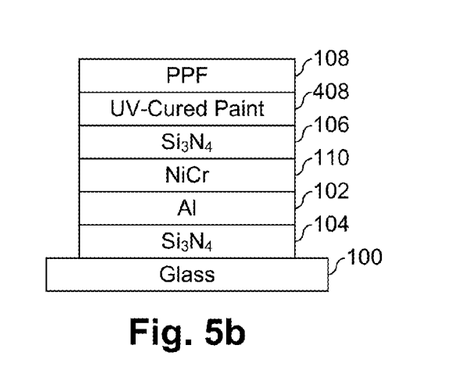

As indicated above, certain example embodiments may include a UV curable paint on top of a sputtered aluminum-based mirror in place of, or in addition to, the PPF. FIGS. 4a-4b are similar to FIGS. 1a-1b, except that the optional PPF layers 108 have been replaced with protective UV-cured paints 408. On the other hand, FIGS. 5a-5b include both protective UV-cured paints 408 and PPF layers 108 thereon. The embodiments shown in FIGS. 4a-4b and in FIGS. 5a and 5b may include some or all of the same thin film layers, disposed at the same or different thicknesses, and having the same or different properties, as those described above (e.g., in connection with FIGS. 1a-1b).

Thus, it will be appreciated that any of the above-described examples may have the PPF simply replaced with the UV curable paint (thereby making the UV cured paint the outermost layer of the mirror), and/or involve the insertion of the UV curable paint just below the PPF (e.g., such that the paint is between the thin film mirror layer stack and the PPF). For instance, in an example replacement scenario, the layer stack may include layers of or including: Glass/SiNx/Al/NiCr/SixNy/paint (rather than Glass/SiNx/Al/NiCr/SixNy/PPF). See FIG. 4b in this regard. In an example insertion scenario, the layer stack may be: Glass/SiNx/Al/NiCr/SixNy/paint/PPF. See FIG. 5b in this regard.

As noted, the above-described layer thicknesses may be used in connection with the paint-inclusive embodiments disclosed herein. Moreover, the presence of the paint also may help to further reduce the glass-side transmission through the coated article, e.g., if the paint is partially or fully opaque. In the above-described layer stack, for example, the layer including Ni and/or Cr may be 10-50 angstroms thick, more preferably 15-50 angstroms thick, but most preferably at least about 20 angstroms thick. The upper SixNy inclusive layer preferably is 100-1000 angstroms thick, more preferably 150-500 angstroms thick, but most preferably at least about 200 angstroms thick, e.g., to provide good mechanical performance/durability. The aluminum thickness may be optimized so that the entire layer stack, together with the paint, provides a glass-side visible transmission that approaches 0% (e.g., preferably less than 15%, more preferably less than 10%, still more preferably less than 5%, and sometimes even lower than 3%) in implementations where very high reflectivity and/or very low transmission is desirable.

The paint may be applied to a suitable density to provide mechanical and/or environmental protection to (e.g., scratch, corrosion, and/or other protection for) the underlying thin film mirror stack. A deposition greater than or equal to about 3 grams per square meter, and more preferably greater than or equal to about 5 grams per square meter generally is sufficient for these purposes. Preferable ranges are 5-100 grams per square meter, and a more preferable range is 10-40 grams per square meter, although higher or lower densities are also possible in different example embodiments. An example is 35 grams per square meter. This sort of paint application can be performed by any suitable technique such as, for example, roll coating, curtain coating, spraying, etc. However, given the potentially easily damaged underlying sputtered thin film layers, non-contact mechanisms such as, for example, spray systems, may be desirable in some cases.

In addition to its protective qualities, the coating and curing line speed is an important factor in selecting an appropriate paint. Preferably, the paint application and curing can be performed without having to slow down the line. For instance, in a commercial environment, this might require application and curing line speeds preferably greater than 5 meters per minute, more preferably greater than 7 meters per minute, and sometimes even faster (e.g., 8-10 or even 15 meters per minute). A practical upper limit for some current applications is about 20 meters per minute, although faster speeds may be or become possible. In order to help reduce the drying time to meet these and/or other requirements, the formulation may be carefully selected and one or more in-line UV lamps may be used to reduce the drying time. For instance, using a paint available from Barpimo (e.g., the Acrilac UV product), drying times at the above-described densities can be reduced to less than 5 seconds, more preferably less than 3 seconds, still more preferably less than 2 seconds, and sometimes even less than 1 second.

Example process conditions for this Barpimo product include irradiation for UV lamps at 300 $J/cm^2$, with a wavelength range of 250-350 nm, at a power of 254 $W/cm^2$. More generally, however, irradiation may be accomplished with irradiation at 100-1000 $J/cm^2$ (and more preferably 200-500 $J/cm^2$), with a wavelength range of 100-400 nm, at a power of 100-400 $W/cm^2$ (and more preferably 150-350 $J/cm^2$). The size of the curing furnace, and the number of UV lamps or other UV sources for instance, may be based on factors such as, for example, the desired line speed, substrate size, etc. It is noted that other curing techniques may be used in addition, or as an alternative, to UV curing. For instance, thermal and/or chemical curing may be used in addition, or as an alternative, to UV curing, e.g., to heat the paint to a predetermined temperature (or temperature range) to promote polymerization and/or to cause a chemical reaction using additives such as, for example, isocyanates or peroxides, respectively.

This sort of process combination is a significant advantage, as it is possible to eliminate the use of heavy metal based paints currently used to protect mirrors. The use of such a paint also is particularly desirable because it can be applied in a single step, generally regardless of the overall lite size. For instance, even "jumbo" width substrates that are 3.21 meters in major distance can be coated with a protective paint. The same is not always true with protective plastic films that may in some cases require overlapping, adjacent (and optionally sealed), and/or other arrangements that include multiple solid state applications.

Initial high temperature-high humidity testing over a seven-day period showed no signs of damage. It is expected that painted products will perform at least as well as the PPF-coated embodiments discussed above. For instance, the above-described tests may be passed. Some or all of the following and/or other tests also may be passed, e.g., over 7 or 20 day periods: a GT test for good adhesion (which tests cross scratching with four pin points, whether there is any delamination or adhesion loss at the crosses); Copper-Accelerated Acetic Acid Salt Spray (Fog) (or CASS) Test according to, for example, ASTM B368, B117; salt-fog tests; etc.

Figure 6:
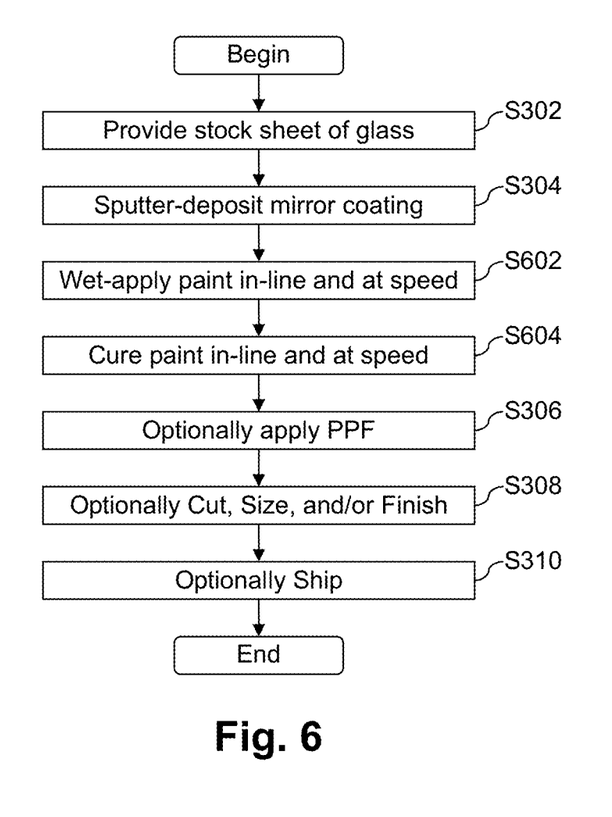
FIG. 6 is another flowchart illustrating another example process for making a mirror in accordance with certain example embodiments.

FIG. 6 is a flowchart illustrating another example process for making a mirror in accordance with certain example embodiments. The FIG. 6 flowchart is similar to the FIG. 3 flowchart, except for the addition of steps S602 and S604. These steps involve applying the protective paint and curing the thus-applied paint, respectively. As indicated above, the paint may be wet-applied to a suitable density and/or cured (e.g., with one or more UV lamps, for example), in-line and/or at the prevailing line speed. The paint, when cured, may be made to cover all or substantially all of the surface area of the coated article. The PPF may be optionally applied in step S306, e.g., after the paint has been applied and cured. Edge deletion optionally may be performed before and/or after the paint is applied.

Although certain example embodiments have been described in connection with metallic or substantially metallic layers comprising aluminum, other reflectors can be used in different example embodiments. Silver-based metallic or substantially reflective layers, for example, may be used in different embodiments of this invention.

In some cases, a flat surface product may be sold. In other cases, the substrate may be bent (e.g., hot or cold bent) before or after the mirror coating, paint, and/or PPF is applied thereto.

Although certain example embodiments have been referred to as including "permanent protective films," it will be appreciated that the word "permanent" should not be read in a strictest or literal sense. Rather, any film that is capable of surviving the above-described and/or other equivalent tests may be considered a "permanent" protective film. Similarly, any film that can survive the expected lifetime of the overall product may be considered sufficiently "permanent" to comply with the way that that word is used herein.

It is noted that the silicon-inclusive layers described herein may be of or include silicon oxide, silicon nitride, silicon oxynitride, and/or the like, in any suitable stoichiometry, in different example embodiments. In certain example embodiments, the silicon-inclusive layers described herein may doped with 1-25% Al, more preferably 1-15% Al, and sometimes 1-5% Al.

While a layer, layer system, coating, or the like, may be said to be "on" or "supported by" a substrate, layer, layer system, coating, or the like, other layer(s) may be provided therebetween. Thus, for example, the coatings or layers described above may be considered "on" and "supported by" the substrate and/or other coatings or layers even if other layer(s) are provided therebetween.

In certain example embodiments, a method of making a mirror is provided. A substrate is provided. A multilayer thin film coating is disposed on the substrate, the multilayer thin film coating comprising, in order moving away from the substrate: a first silicon-inclusive layer, a metallic or substantially metallic layer comprising aluminum, and a second silicon-inclusive layer. A protective paint is wet-applied directly over and contacting an outermost layer of the multilayer thin film coating, with the protective paint being applied to ensure a post-cure density of 5-100 grams per square meter. The protective paint is cured. Following said curing, the protective paint is adapted to survive seven day exposure to an 85 degree C. temperature at 85% relative humidity, as well as seven day exposure to a 49 degree C. temperature at 100% relative humidity.

In addition to the features of the previous paragraph, in certain example embodiments, the first and second silicon-inclusive layers each comprise silicon nitride.

In addition to the features of either of the two previous paragraphs, in certain example embodiments, the first and second silicon-inclusive layers may be less than 100 angstroms thick and 70-200 angstroms thick, respectively, and the metallic or substantially metallic layer comprising aluminum may be 250-650 angstroms thick.

In addition to the features of the previous paragraph, in certain example embodiments, a layer comprising NiCr may be interposed between the metallic or substantially metallic layer comprising aluminum and the second silicon-inclusive layer, and the layer comprising NiCr may be 5-20 angstroms thick.

In addition to the features of any of the previous four paragraphs, in certain example embodiments, a layer comprising Ni and/or Cr may be interposed between the metallic or substantially metallic layer comprising aluminum and the second silicon-inclusive layer.

In addition to the features of the previous paragraph, in certain example embodiments, the layer comprising Ni and/or Cr may be 5-20 angstroms thick and may directly contact both the metallic or substantially metallic layer comprising aluminum and the second silicon-inclusive layer.

In addition to the features of any of the previous six paragraphs, in certain example embodiments, a layer comprising Ni and/or Cr may be interposed between and directly contact both the metallic or substantially metallic layer comprising aluminum and the second silicon-inclusive layer, and the layer comprising Ni and/or Cr may be at least 20 angstroms thick, and the second silicon-inclusive layer may be at least 200 angstroms thick.

In addition to the features of any of the previous seven paragraphs, in certain example embodiments, the coated article may have a glass side reflectance of at least 76%.

In addition to the features of any of the previous eight paragraphs, in certain example embodiments, the coated article may have a glass side reflectance of at least 82%.

In addition to the features of any of the previous nine paragraphs, in certain example embodiments, the protective paint may be applied and cured at a line speed of at least 7 meters per minute.

In addition to the features of any of the previous ten paragraphs, in certain example embodiments, each said layer in the multilayer thin film may be sputter deposited, and the protective paint may be applied via spraying.

In certain example embodiments, a method of making a coated article is provided.

A coating comprising at least the following layers in the following order is sputter-deposited on a glass substrate: a first silicon-inclusive layer, a metallic or substantially metallic layer, and a second silicon-inclusive layer. A protective paint is wet-applied directly over and contacting an outermost layer of the coating, with the protective paint being curable in less than 2 seconds of exposure to a UV radiation source. The protective paint is cured using at least one UV radiation source. The protective paint is wet-applied and cured at a line speed of greater than 7 meters per minute.

In addition to the features of the previous paragraph, in certain example embodiments, the protective paint, after curing, may be adapted to survive seven day exposure to an 85 degree C. temperature at 85% relative humidity, as well as seven day exposure to a 49 degree C. temperature at 100% relative humidity, with no evidence of delamination of the protective paint and no evidence of deterioration of the coating.

In addition to the features of either of the two previous paragraphs, in certain example embodiments, the first and second silicon-inclusive layers may each comprise silicon nitride.

In addition to the features of any of the previous three paragraphs, in certain example embodiments, the first and second silicon-inclusive layers may be less than 100 angstroms thick and 70-200 angstroms thick, respectively, and the metallic or substantially metallic layer comprises may aluminum and may be 250-650 angstroms thick.

In addition to the features of any of the previous four paragraphs, in certain example embodiments, a layer comprising NiCr may be sputter deposited directly on and contacting the metallic or substantially metallic layer, which comprises aluminum, and the layer comprising NiCr may be 5-150 angstroms thick.

In addition to the features of any of the previous five paragraphs, in certain example embodiments, the protective paint, post curing, may be opaque.

In addition to the features of any of the previous six paragraphs, in certain example embodiments, a layer comprising Ni and/or Cr may be interposed between and directly contact both the metallic or substantially metallic layer, which may comprise aluminum, and the second silicon-inclusive layer, the layer comprising Ni and/or Cr may be at least 20 angstroms thick, and the second silicon-inclusive layer may be at least 200 angstroms thick.

In addition to the features of the previous paragraph, in certain example embodiments, visible transmission through the coated article with the protective paint thereon may be less than 5%.

In addition to the features of any of the previous eight paragraphs, in certain example embodiments, the coated article may have a glass side reflectance of at least 76%.

In addition to the features of any of the previous nine paragraphs, in certain example embodiments, the coated article may have a glass side reflectance of at least 82%.

In addition to the features of any of the previous ten paragraphs, in certain example embodiments, after said curing, a protective plastic film may be disposed over the protective paint.

In addition to the features of any of the previous 11 paragraphs, in certain example embodiments, the protective paint may be applied to ensure a post-cure density of 10-40 grams per square meter.

In certain example embodiments, a method of making mirrors is provided. For example, a coated article made in accordance with the method of any of the preceding 23 paragraphs may be received at a fabricator location. The coated article may be cut into pieces of one or more respective desired sizes in making the mirrors.

In certain example embodiments, a coated article is provided. A glass substrate supports a sputter-deposited coating, the coating comprising at least the following layers in the following order: a first silicon-inclusive layer, a metallic or substantially metallic layer comprising aluminum, and a second silicon-inclusive layer. A protective paint is applied directly over and contacting an outermost layer of the coating, with the protective paint being curable in less than 2 seconds of exposure to a UV radiation source and at a line speed of greater than 7 meters per minute. The protective paint, after curing, is adapted to survive seven day exposure to an 85 degree C. temperature at 85% relative humidity, as well as seven day exposure to a 49 degree C. temperature at 100% relative humidity, with no evidence of delamination of the protective paint and no evidence of deterioration of the coating. The protective paint may be applied to ensure a post-cure density of 10-40 grams per square meter, in some cases.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a mirror, the method comprising:
   providing a substrate;
   disposing a multilayer thin film coating on the substrate, the multilayer thin film coating comprising, in order moving away from the substrate:
   a first silicon-inclusive layer,
   a metallic or substantially metallic layer comprising aluminum,
   a second silicon-inclusive layer; and
   wet-applying a protective paint directly over and contacting an outermost layer of the multilayer thin film coating, the protective paint being applied to ensure a post-cure density of 5-100 grams per square meter, and wherein the protective paint comprises oxybis (methyl-2, 1-ethanediyl) diacrylate and is ultraviolet (UV) curable; and
   curing the protective paint, said curing comprising ultraviolet (UV) curing and the protective paint being cured in less than 2 seconds of exposure to a UV radiation source,
   wherein, following said curing, the protective paint is adapted to survive seven day exposure to an 85 degree C. temperature at 85% relative humidity, as well as seven day exposure to a 49 degree C. temperature at 100% relative humidity.

2. The method of claim 1, wherein the first and second silicon-inclusive layers each comprise silicon nitride.

3. The method of claim 1, wherein the first and second silicon-inclusive layers are less than 100 angstroms thick and 70-200 angstroms thick, respectively, and wherein the metallic or substantially metallic layer comprising aluminum is 250-650 angstroms thick.

4. The method of claim 3, wherein a layer comprising NiCr is interposed between the metallic or substantially metallic layer comprising aluminum and the second silicon-inclusive layer, and wherein the layer comprising NiCr is 5-20 angstroms thick.

5. The method of claim 1, wherein a layer comprising Ni and/or Cr is interposed between the metallic or substantially metallic layer comprising aluminum and the second silicon-inclusive layer.

6. The method of claim 5, wherein the layer comprising Ni and/or Cr is 5-20 angstroms thick and directly contacts both the metallic or substantially metallic layer comprising aluminum and the second silicon-inclusive layer.

7. The method of claim 1, wherein:
a layer comprising Ni and/or Cr is interposed between and directly contacts both the metallic or substantially metallic layer comprising aluminum and the second silicon-inclusive layer,
the layer comprising Ni and/or Cr is at least 20 angstroms thick, and
the second silicon-inclusive layer is at least 200 angstroms thick.

8. The method of claim 1, wherein the mirror has a glass side reflectance of at least 76%.

9. The method of claim 1, wherein the mirror has a glass side reflectance of at least 82%.

10. The method of claim 1, wherein the protective paint is applied and cured at a line speed of at least 7 meters per minute.

11. The method of claim 1, wherein each said layer in the multilayer thin film coating is sputter deposited, and wherein the protective paint is applied via spraying.

12. A method of making a coated article, the method comprising:
sputter-depositing on a glass substrate a coating comprising at least the following layers in the following order:
a first silicon-inclusive layer,
a metallic or substantially metallic layer, and
a second silicon-inclusive layer; and
wet-applying a protective paint directly over and contacting an outermost layer of the coating,
wherein the protective paint comprises oxybis (methyl-2, 1-ethanediyl) diacrylate; and
curing the protective paint using at least one UV radiation source and in said curing the protective paint is UV cured in less than 2 seconds of exposure to the at least one UV radiation source,
wherein the protective paint is wet-applied and cured at a line speed of greater than 7 meters per minute.

13. The method of claim 12, wherein the protective paint, after curing, is adapted to survive seven day exposure to an 85 degree C. temperature at 85% relative humidity, as well as seven day exposure to a 49 degree C. temperature at 100% relative humidity, with no evidence of delamination of the protective paint and no evidence of deterioration of the coating.

14. The method of claim 12, wherein the first and second silicon-inclusive layers each comprise silicon nitride.

15. The method of claim 12, wherein the first and second silicon-inclusive layers are less than 100 angstroms thick and 70-200 angstroms thick, respectively, and wherein the metallic or substantially metallic layer comprises aluminum and is 250-650 angstroms thick.

16. The method of claim 12, further comprising sputter depositing a layer comprising NiCr directly on and contacting the metallic or substantially metallic layer, which comprises aluminum,
wherein the layer comprising NiCr is 5-150 angstroms thick.

17. The method of claim 12, wherein the protective paint, post curing, is opaque.

18. The method of claim 12, wherein:
a layer comprising Ni and/or Cr is interposed between and directly contacts both the metallic or substantially metallic layer, which comprises aluminum, and the second silicon-inclusive layer,
the layer comprising Ni and/or Cr is at least 20 angstroms thick, and
the second silicon-inclusive layer is at least 200 angstroms thick.

19. The method of claim 18, wherein visible transmission through the coated article with the protective paint thereon is less than 5%.

20. The method of claim 12, wherein the coated article has a glass side reflectance of at least 76%.

21. The method of claim 12, wherein the coated article has a glass side reflectance of at least 82%.

22. The method of claim 12, further comprising, after said curing, disposing a protective plastic film over the protective paint.

23. The method of claim 12, wherein the protective paint is applied to ensure a post-cure density of 10-40 grams per square meter.

24. A method of making mirrors, the method comprising:
receiving, at a fabricator location, a coated article made in accordance with the method of claim 12; and
cutting the coated article into pieces of one or more respective desired sizes in making the mirrors.

* * * * *